(12) United States Patent
Hua et al.

(10) Patent No.: US 10,697,065 B2
(45) Date of Patent: Jun. 30, 2020

(54) SAM ASSISTED SELECTIVE E-LESS PLATING ON PACKAGING MATERIALS

(71) Applicant: Intel Corporation, Santa Clara, CA (US)

(72) Inventors: Fay Hua, Fremont, CA (US); Aranzazu Maestre Caro, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/769,699

(22) PCT Filed: Aug. 8, 2016

(86) PCT No.: PCT/US2016/046047
§ 371 (c)(1),
(2) Date: Apr. 19, 2018

(87) PCT Pub. No.: WO2017/095485
PCT Pub. Date: Jun. 8, 2017

(65) Prior Publication Data
US 2018/0305818 A1      Oct. 25, 2018

Related U.S. Application Data

(63) Continuation of application No. 14/954,359, filed on Nov. 30, 2015, now abandoned.

(51) Int. Cl.
*H05K 3/46* (2006.01)
*C23C 18/20* (2006.01)
(Continued)

(52) U.S. Cl.
CPC ........ *C23C 18/2006* (2013.01); *C23C 18/165* (2013.01); *H01L 21/481* (2013.01); *H01L 21/4846* (2013.01); *H05K 3/4629* (2013.01)

(58) Field of Classification Search
CPC .......................... H05K 3/4629; H05K 3/4632
See application file for complete search history.

(56) References Cited

U.S. PATENT DOCUMENTS

2002/0182385 A1   12/2002   Senkevich et al.
2003/0203311 A1   10/2003   Dobisz et al.
(Continued)

FOREIGN PATENT DOCUMENTS

WO   WO-2006108642   10/2006

OTHER PUBLICATIONS

International Preliminary Search Report for PCT/US2016/046047 dated Jun. 14, 2018, 9 pgs.

(Continued)

*Primary Examiner* — Jeremy C Norris
(74) *Attorney, Agent, or Firm* — Schwabe, Williamson & Wyatt, P.C.

(57) ABSTRACT

A method including activating an area of a polymer layer on a substrate with electromagnetic radiation; modifying the activated area; forming a self-assembled monolayer on the modified active area; reacting the self-assembled monolayer with the self-assembled monolayer; and reacting the self-assembled monolayer with a conductive material. A method including activating an area of a polymer dielectric layer on a substrate with electromagnetic radiation, the area selected for an electrically conductive line; modifying the activated area; forming a self-assembled monolayer on the modified active area; reacting the self-assembled monolayer with a catalyst; and electroless plating a conductive material on the self-assembled monolayer.

17 Claims, 6 Drawing Sheets

(51) Int. Cl.
*H01L 21/48* (2006.01)
*C23C 18/16* (2006.01)

(56) References Cited

U.S. PATENT DOCUMENTS

| | | | |
|---|---|---|---|
| 2007/0278478 A1* | 12/2007 | Zaumseil | B82Y 10/00 |
| | | | 257/40 |
| 2008/0150148 A1 | 6/2008 | Frey et al. | |
| 2010/0187002 A1 | 7/2010 | Lee et al. | |
| 2010/0263919 A1 | 10/2010 | Lee et al. | |
| 2011/0168669 A1 | 7/2011 | Cho et al. | |
| 2011/0292622 A1 | 12/2011 | Hovestad et al. | |
| 2014/0065290 A1 | 3/2014 | Lewis et al. | |
| 2017/0054076 A1* | 2/2017 | Nagata | C08F 220/32 |

OTHER PUBLICATIONS

International Search Report and Written Opinion for International Patent Application No. PCT/US2015/046047 dated Dec. 1, 2016, 12 pgs.
Non-Final Office Action for U.S. Appl. No. 14/954,359 dated Jan. 11, 2017, 16 pgs.
Final Office Action for U.S. Appl. No. 14/954,359 dated May 4, 2017, 16 pgs.
Advisory Action for U.S. Appl. No. 14/954,359 dated Sep. 18, 2017, 4 pgs.

\* cited by examiner

_US 10,697,065 B2_

SAM ASSISTED SELECTIVE E-LESS PLATING ON PACKAGING MATERIALS

CROSS-REFERENCE TO RELATED APPLICATION

This patent application is a U.S. National Phase Application under 35 U.S.C. § 371 of International Application No. PCT/US2016/046047, filed Aug. 8, 2016, entitled "SAM ASSISTED SELECTIVE E-LESS PLATING ON PACKAGING MATERIALS," which designates the United States of America, which claims priority to U.S. patent application Ser. No. 14/954,359 filed Nov. 30, 2015, the entire disclosures of which are hereby incorporated by reference in their entirety and for all purposes.

FIELD

Plating of conductive lines for circuit interconnects and packaging material.

BACKGROUND

One current process or method for forming conductive lines or traces in or on an integrated circuit chip package substrate can be described as semi-additive. Such process involves depositing a blanket seed layer of a conductive material on a dielectric layer followed by a patterning of a mask with an opening conductive line or trace. An electrolytic plating process then follows to deposit an electrically conductive material such as copper on the seed layer in the opening in the mask. The mask is then removed as is unwanted seed material to leave the conductive line or trace on the substrate.

DETAILED DESCRIPTION

A method of forming a conductive line or trace on a substrate such as a package substrate or integrated circuit is described. In one embodiment, a conductive line or trace is formed on a dielectric material by chemically bonding a conductive material for the line or trace to the dielectric material through a self-assembled monolayer. In one embodiment, a method includes activating an area of a polymer layer on a substrate with, for example, electromagnetic radiation; modifying the activated area; forming a self-assembled monolayer on the modified active layer; reacting the self-assembled monolayer with a catalyst; and reacting the self-assembled monolayer with an electrically conducted material. A substrate comprising a plurality of electrically conductive lines or traces formed on a dielectric material is also described. The conductive lines are formed of conductive material chemically bonded to the dielectric material through a self-assembled monolayer.

Figure 1:
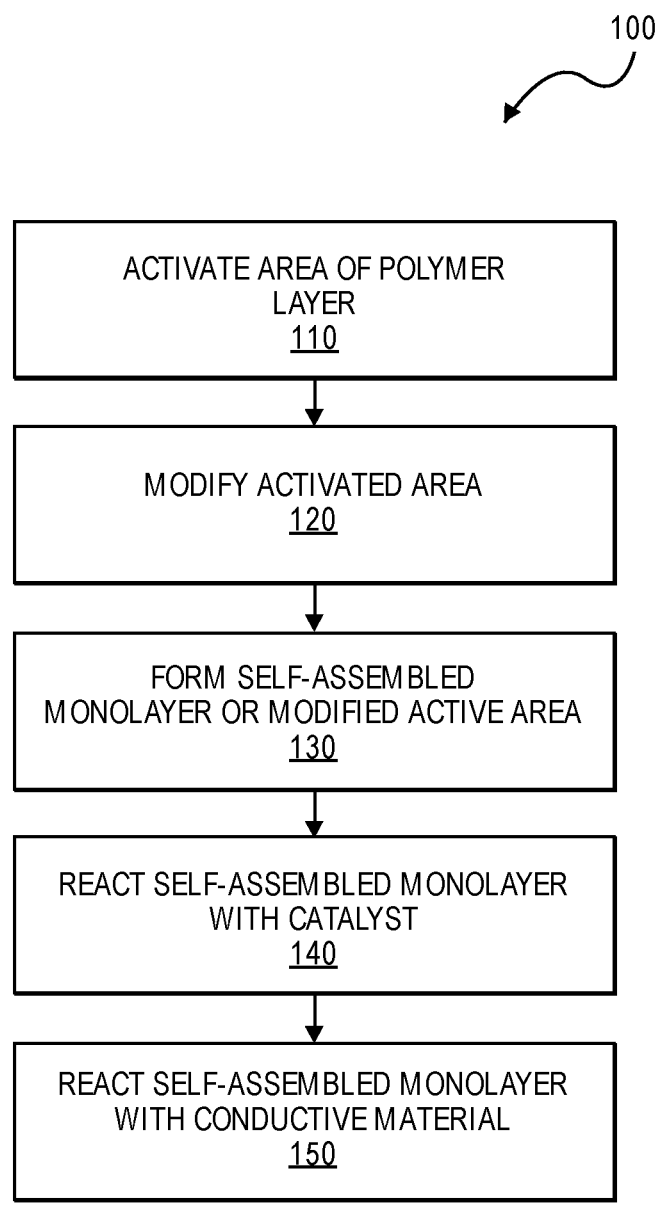
FIG. 1 shows a flowchart of a method of forming a conductive line or trace on a substrate.

FIG. 1 presents a flowchart of one method of forming an electrically conductive line or trace on a substrate. Process 100 includes activating an area of a polymer layer where it is desired to form a conductive line or trace (block 110). In one embodiment, the polymer layer may be a dielectric film of a package substrate such as ABF or an epoxy or other resin. In one embodiment, the polymer layer may be activated by exposure to electromagnetic radiation such as ultraviolet (UV) laser radiation. One example is a 355-nanometer wavelength UV laser. Without wishing to be bound by theory, the activation serves to break or otherwise disassociate bonds in the polymer layer.

Figure 2:
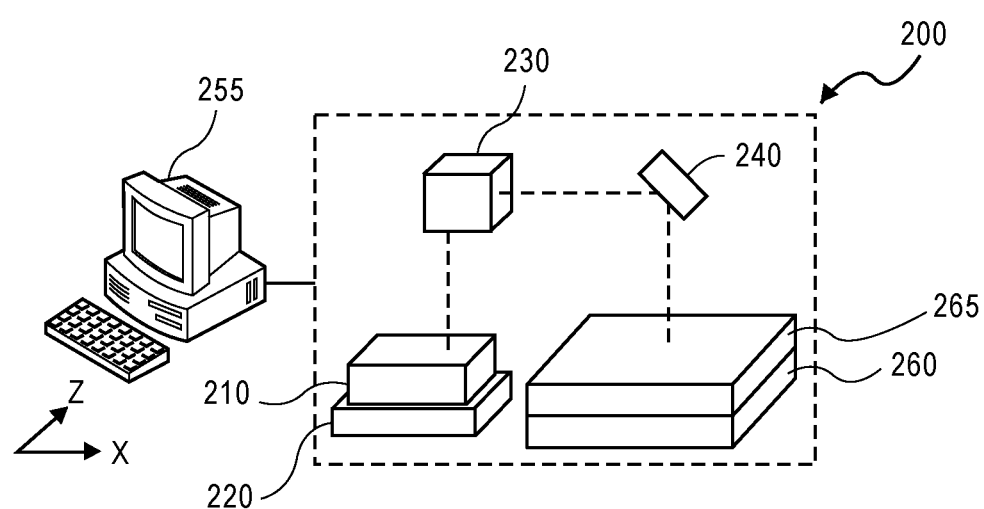
FIG. 2 shows a schematic top perspective view of a system utilizing a laser to activate a polymer layer of a substrate according to the method of FIG. 1.

FIG. 2 shows a top perspective view of one technique for activating an area of a polymer layer with a pulsed-wave ultraviolet laser. Referring to FIG. 2, system 200 shows, in this embodiment, package substrate 260 having polymer film or layer 265 over a surface thereof (a superior surface as viewed). Package substrate 260 is disposed on stage 250. System 200 includes pulsed-wave ultraviolet (UV) laser 210 connected to servomechanism 220 that controls a mechanical position in at least an XZ direction of laser 210. Laser 210 directs electromagnetic radiation in the form of a beam to galvanometer 230 that steers the beam towards stage 250. In one embodiment, the laser has a wavelength of 355 nanometers and a power of 29 amps at 0.904 watts. A width of the beam, in one embodiment, is similar to a width of a desired line of trace to be patterned on polymer layer 265. Mirror 240 may be disposed between galvanometer 230 and stage 250 to, for example, collimate the radiation. FIG. 2 shows computer 255 that may contain a Drawing eXchange Format (DXF) file of a line or trace pattern for a specific package substrate. A DXF file of a trace or line pattern for substrate 260 is transferred from computer 255 to system 200 and non-transitory machine-readable instructions stored in computer 255 may be executed to direct a laser activation process of polymer layer 265 of package substrate 260 on stage 250 of the system.

Referring again to FIG. 1, following the activation of an area of a polymer layer such as through the use of electromagnetic radiation, process 100 describes modifying the activated area (block 120). In one embodiment, the activated area of a polymer layer is modified by making the area rich in hydroxyl (—OH) moieties. Representatively, the substrate (e.g., substrate 260, FIG. 2) may be exposed to water such as by placing the substrate in a tank of water to allow hydroxyl moieties to react or otherwise bond with the active area in, for example, a hydrolysis process forming a hydroxyl-rich area on the polymer layer.

Figure 3:
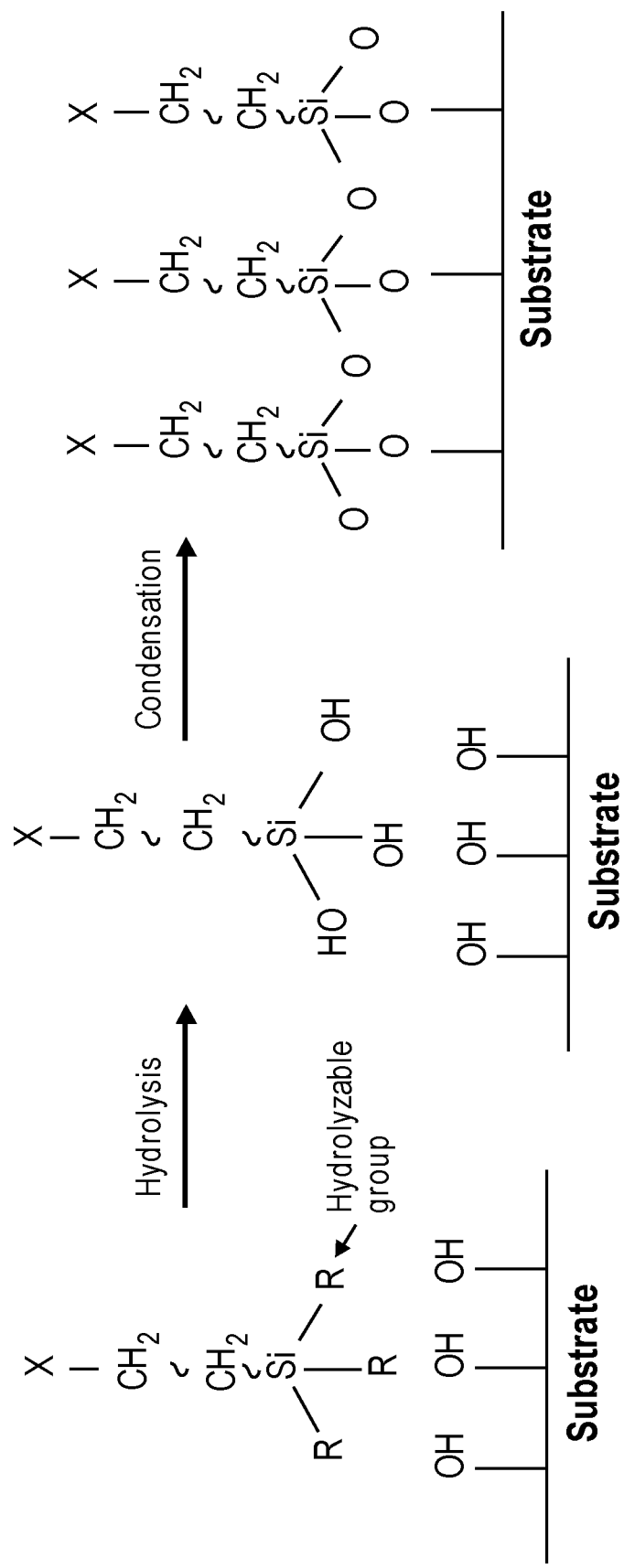
FIG. 3 shows a representation of hydrolysis of an organosilicon compound and condensation of the hydrolyzed organosilicon compound according to the method of FIG. 1 to form a self-assembled monolayer.

Following the modifying of the activated area, process 100 describes forming a self-assembled monolayer on the modified active area. In one embodiment, a self-assembled monolayer is formed from an organosilicon compound such as a siloxane (e.g., $R_3Si$—O—$SiR_3$) or silanol (e.g., $R_3SiOH$). An example of a siloxane self-assembled monolayer grafting on a modified activated area of a substrate is shown in FIG. 3. Initially, an organosilicon compound is dissolved in a solvent such as toluene, dimethylformamide (DMF) or hexane and introduced to the substrate. Initially, the organosilicon (e.g., siloxane) undergoes hydrolysis followed by a condensation with hydroxyl moieties on the substrate to form the monolayer. In one embodiment, the organosilicon compound includes a functional group, X, that is suitable for reaction of the organosilicon compound with a catalyst. Representative functional groups include but are not limited to an amine moiety, a sulfhydryl moiety and a pyridil moiety for reacting with a palladium (Pd) catalyst. Referring to FIG. 3, the bonded self-assembled monolayer is shown with a head having a functional group, X, suitable for reaction with a catalyst in a subsequent operation.

Figure 4:
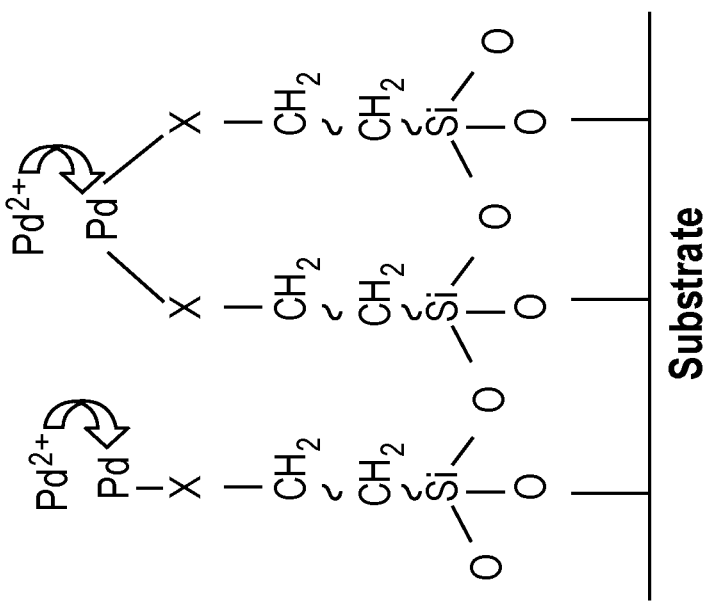
FIG. 4 shows a representation of the self-assembled monolayer of FIG. 3 absorbing a catalyst according to the method of FIG. 1.

Referring to FIG. 1, following the formation of a self-assembled monolayer on the modified active area, method 100 includes reacting the self-assembled monolayer with a catalyst (block 140). Where the self-assembled monolayer includes a head having a reactive functional group (e.g., an amine moiety, a sulfhydryl moiety, a pyridil moiety), the monolayer is capable of reacting or operable to react with a catalyst. FIG. 4 shows the reaction of palladium ions with functional groups of a self-assembled monolayer attached to a substrate. Palladium is in an oxidized state ($Pd^{2+}$) in solution (e.g., $PdCl_2$). The palladium ions attach to the functional groups of the self-assembled monolayer. Because the self-assembled monolayer is on the activated area, the palladium catalyst reaction (e.g., absorption) will be carried out on the activated area.

Figure 5:
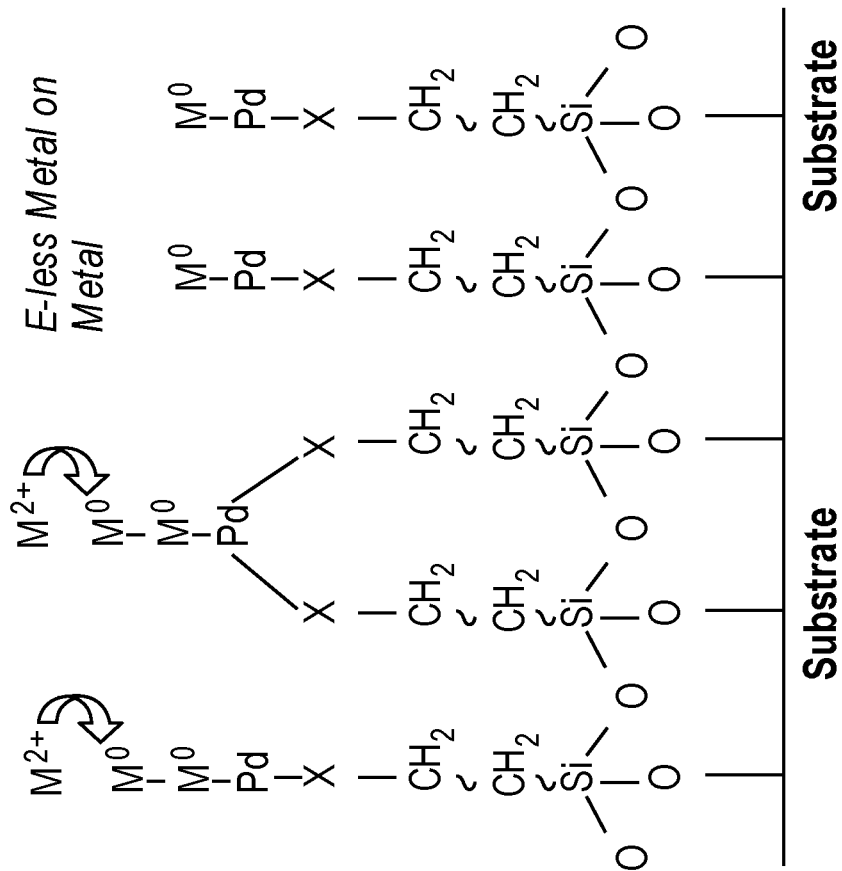
FIG. 5 shows a representation of the self-assembled monolayer of FIG. 4 reacting with a metal according to the method of FIG. 1.

Referring to FIG. 1, following the reaction of a self-assembled monolayer with a catalyst, method 100 includes reacting the modified self-assembled monolayer with a conductive material. FIG. 5 shows the reaction of a metal material with the palladium catalyst on the self-assembled monolayer. In one embodiment, a substrate is placed in a bath with an ionic form of the metal (e.g., nickel ion, copper ion, etc.) and a reducing agent such as an amine, a borane or a hypophosphite. In the bath, an electroless oxidation-reduction (redox) reaction occurs between the agent in the bath and an electrolyte. The reducing agent is oxidized and palladium on the self-assembled monolayer is reduced. The reduced palladium acts as a catalyst for a reduction of the metal ions in the bath (e.g., nickel, copper) to metallic to form first nuclei and then a metal film allowing metallization of lines of a predetermined shape and size.

The above method is suitable for forming conductive lines by an electro-less process through the use of self-assembled monolayers grafted on activated substrates. The self-assembled monolayers have the ability of uptaking and fixing catalyst ions (e.g., palladium) that will act as nucleation points for a metal electroless reaction. Placing a substrate in an electroless bath allows desired metal ions (e.g., nickel, copper) to be reduced to form the metal line of trace. A thickness of the metal may be targeted based on the exposure of the substrate to the bath. Metallization of lines of any size or shape may be formed according to the process.

Figure 6:
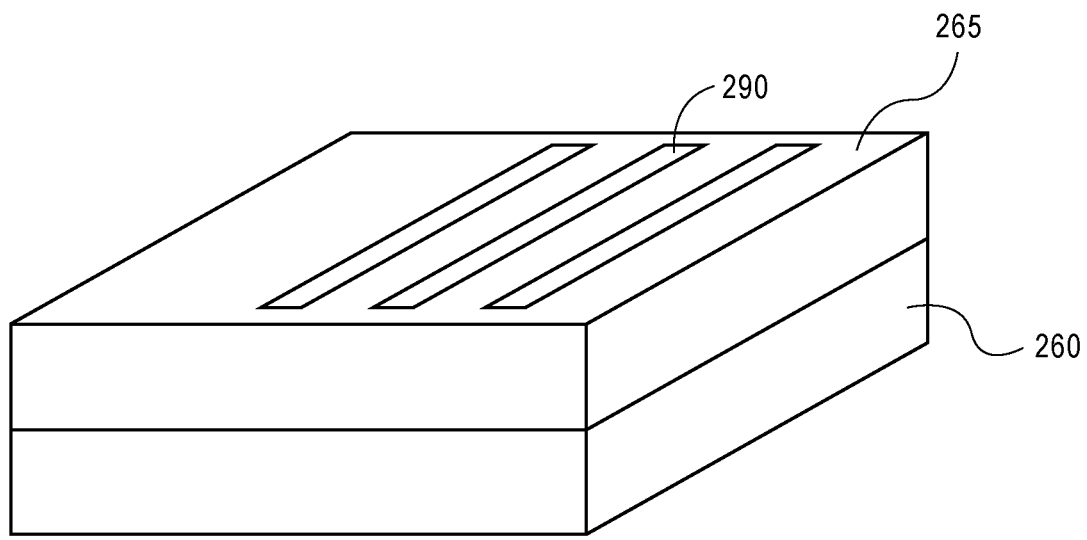
FIG. 6 shows a top, side perspective view of a substrate, having a dielectric polymer layer formed thereon and conductive metal lines formed on the polymer layer.

FIG. 6 shows a top side perspective view of a package substrate having a polymer dielectric layer formed thereon with conductive lines on a service thereof formed by the process described above. FIG. 6 shows substrate 260 having polymer layer 265 form thereon. On a surface of polymer layer 265 are conductive layers 290 that are formed of an electrically conductive material such as nickel or copper that is chemically bonded to the dielectric material through a self-assembled monolayer as described. It is appreciated that a package substrate is one suitable substrate for forming electrically conductive lines or traces as described. It is that such conductive lines or traces may be formed on other substrates including, not limited to, dielectric layers of integrated circuit substrates. In addition, FIG. 6 illustrates a relatively planer surface on which conductive lines or traces 290 are formed. It is appreciated that the process described is also suitable for other surfaces, such as but not limited to, three-dimensional circuit interconnect structures (e.g., trace on mold, etc.) and flexible circuit interconnects.

Figure 7:
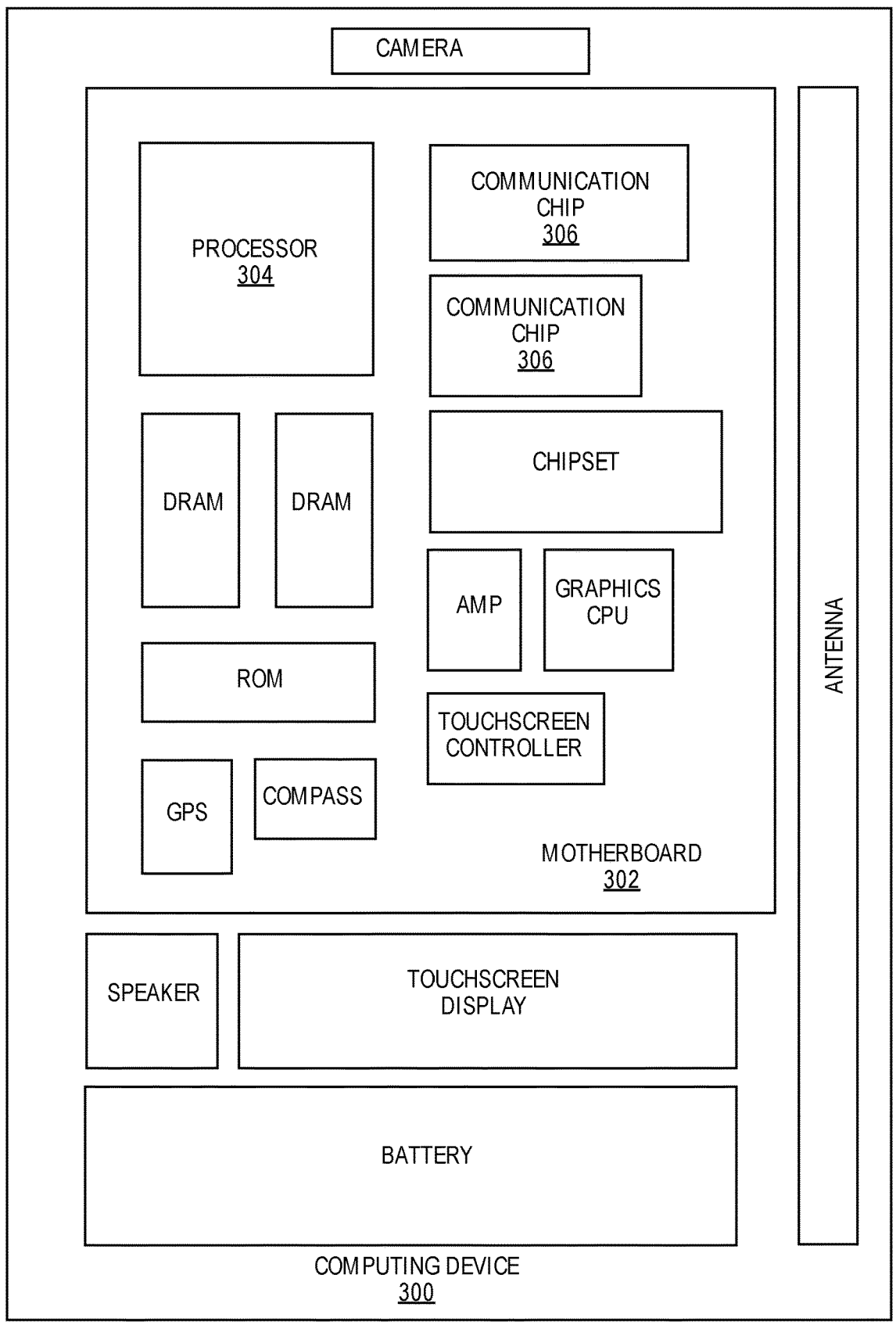
FIG. 7 illustrates an embodiment of a computing device.

FIG. 7 illustrates computing device 300 in accordance with one implementation. Computing device 300 houses printed circuit board 302. Board 302 may include a number of components, including but not limited to processor 304 and at least one communication chip 306. Processor 304 is physically and electrically coupled to board 302. In some implementations at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.3 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, first communication chip 306 may be dedicated to shorter range wireless communications such as Wi-Fi and Bluetooth and second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the integrated circuit die of the processor includes one or more devices, such as transistors or metal interconnects, and includes I/O contacts. Processor 304 may be packaged with a package substrate in an assembly, where the package substrate includes conductive lines or traces formed of conductive material chemically bonded to a dielectric material through a self-assembled monolayer as described herein. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, the integrated circuit die of the communication chip includes one or more devices, such as transistors or metal interconnects, and includes I/O contacts. Communication chip 306 may be packaged with a package substrate in an assembly, where the package substrate includes conductive lines or traces formed of conductive material chemically bonded to a dielectric material through a self-assembled monolayer as described herein.

In further implementations, another component housed within computing device 300 may contain an integrated circuit die that includes one or more devices, such as transistors or metal interconnects, and includes I/O contacts. The integrated circuit die may be packaged with a package substrate in an assembly, where the package substrate includes conductive lines or traces formed of conductive material chemically bonded to a dielectric material through a self-assembled monolayer as described herein.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

Example 1 is a method including activating an area of a polymer layer on a substrate with electromagnetic radiation; modifying the activated area; forming a self-assembled monolayer on the modified active area; reacting the self-assembled monolayer with the self-assembled monolayer; and reacting the self-assembled monolayer with a conductive material.

In Example 2, modifying the activated area in the method of Example 1 includes forming a hydroxyl ion rich area.

In Example 3, the self-assembled monolayer in the method of Example 1 includes a functional group operable to react with the catalyst.

In Example 4, the functional group in the method of Example 1 includes one of an amine moiety, a sulfhydryl moiety and a pyridil moiety.

In Example 5, prior to reacting the self-assembled monolayer with a conductive material, the method of Example 1 includes reacting the self-assembled monolayer with a catalyst.

In Example 6, the catalyst in the method of Example 5 is a metal and reacting the self-assembled monolayer with a conductive material comprises reducing the catalyst in a bath including a reducing agent and the conductive material.

In Example 7, the bath in the method of Example 6 includes the conductive material in an oxidized state and the reducing agent reacting the self-assembled monolayer with a conductive material includes reducing the state of the conductive material.

In Example 8, the substrate in the method of Example 1 includes a package substrate.

Example 9 is a method including activating an area of a polymer dielectric layer on a substrate with electromagnetic radiation, the area selected for an electrically conductive line; modifying the activated area; forming a self-assembled monolayer on the modified active area; reacting the self-assembled monolayer with a catalyst; and electroless plating a conductive material on the self-assembled monolayer.

In Example 10, modifying the activated area in the method of Example 9 includes forming a hydroxyl ion rich area.

In Example 11, the self-assembled monolayer of the method of Example 9 includes a functional group operable to react with the catalyst.

In Example 12, the functional group of the method of Example 11 includes one of an amine moiety, a sulfhydryl moiety and a pyridil moiety.

In Example 13, the catalyst of the method of Example 9 includes palladium.

In Example 14, electroless plating a conductive material in the method of Example 9 includes reducing the catalyst in a bath including a reducing agent that is oxidized.

In Example 15, the bath in the method of Example 14 includes the conductive material in an oxidized state and electroless plating a conductive material includes reducing the state of the conductive material.

In Example 16, the substrate in the method of Example 9 includes a package substrate. Example 17 is a substrate including a plurality of conductive lines formed on dielectric material, the conductive lines formed of conductive material chemically bonded to the dielectric material through a self-assembled monolayer.

In Example 18, the conductive material of the substrate of Example 17 is chemically bonded to the self-assembled monolayer through a catalyst.

In Example 19, the dielectric material of the substrate of Example 17 includes a polymer material.

In Example 20, the substrate of Example 17 is a package substrate.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

What is claimed is:

1. An integrated circuit chip package substrate comprising a plurality of conductive lines formed on a radiation-activated dielectric material, the conductive lines formed of conductive material chemically bonded to the dielectric material through a self-assembled monolayer.

2. The substrate of claim 1, wherein the conductive material is chemically bonded to the self-assembled monolayer through a catalyst.

3. The substrate of claim 1, wherein the dielectric material comprises a polymer material.

4. A method comprising:
   activating an area of a polymer layer on a package substrate by exposing portions of a surface of the polymer layer to electromagnetic radiation;
   modifying the activated area;
   forming a self-assembled monolayer on the modified active area;
   reacting the self-assembled monolayer with a catalyst; and reacting the self-assembled monolayer with a conductive material.

5. The method of claim 4, wherein modifying the activated area comprises forming a hydroxyl ion rich area.

6. The method of claim 4, wherein the self-assembled monolayer comprises a functional group operable to react with the catalyst.

7. The method of claim 6, wherein the functional group comprises one of an amine moiety, a sulfhydryl moiety and a pyridil moiety.

8. The method of claim 4, wherein the catalyst is a metal and reacting the self-assembled monolayer with a conductive material comprises reducing the catalyst in a bath comprising a reducing agent and an ionic form of the conductive material.

9. The method of claim 8, wherein reacting the self-assembled monolayer with a conductive material comprises reducing the state of the ionic form of conductive material.

10. A method comprising:
activating an area of a polymer dielectric layer on a substrate by exposing portions of a surface of the polymer layer to electromagnetic radiation, the area selected for an electrically conductive line;
modifying the activated area;
forming a self-assembled monolayer on the modified active area;
reacting the self-assembled monolayer with a catalyst; and
electroless plating a conductive material on the self-assembled monolayer.

11. The method of claim 10, wherein modifying the activated area comprises forming a hydroxyl ion rich area.

12. The method of claim 10, wherein the self-assembled monolayer comprises a functional group operable to react with the catalyst.

13. The method of claim 12, wherein the functional group comprises one of an amine moiety, a sulfhydryl moiety and a pyridil moiety.

14. The method of claim 10, wherein the catalyst comprises palladium.

15. The method of claim 10, wherein electroless plating a conductive material comprises reducing the catalyst in a bath comprising a reducing agent that is oxidized.

16. The method of claim 15, wherein the bath comprises an ionic form of the conductive material in an oxidized state and electroless plating a conductive material comprises reducing the state of the ionic form of the conductive material.

17. The method of claim 10, wherein the substrate comprises a package substrate.

* * * * *